(12) United States Patent
Kuo et al.

(10) Patent No.: US 8,649,172 B2
(45) Date of Patent: Feb. 11, 2014

(54) FIXING ASSEMBLY FOR FAN MODULE

(75) Inventors: Chung-I Kuo, Luzhu Township, Taoyuan County (TW); Chen-Tung Sun, Luzhu Township, Taoyuan County (TW); Ta-Chih Chung, Luzhu Township, Taoyuan County (TW)

(73) Assignee: AIC Inc., Taoyuan County (TW)

( * ) Notice: Subject to any disclaimer, the term of this patent is extended or adjusted under 35 U.S.C. 154(b) by 72 days.

(21) Appl. No.: 13/368,078

(22) Filed: Feb. 7, 2012

(65) Prior Publication Data
US 2013/0200249 A1    Aug. 8, 2013

(51) Int. Cl.
*H05K 5/00* (2006.01)
(52) U.S. Cl.
USPC ............... 361/679.49; 361/679.47; 361/695
(58) Field of Classification Search
USPC ............ 248/346.01, 346.03, 346.06, 346.4, 248/346.5; 361/676, 678, 679.46, 679.47, 361/679.48, 679.49, 688, 695; 454/184; 312/223.2, 223.1
See application file for complete search history.

(56) References Cited

U.S. PATENT DOCUMENTS

| | | | |
|---|---|---|---|
| 6,556,437 B1* | 4/2003 | Hardin | 361/679.48 |
| 6,592,449 B2* | 7/2003 | Cipolla et al. | 454/184 |
| 7,684,191 B1* | 3/2010 | Willis et al. | 361/695 |
| 7,874,348 B2* | 1/2011 | Liu et al. | 165/121 |
| 8,371,805 B2* | 2/2013 | Peng et al. | 415/119 |
| 2007/0153477 A1* | 7/2007 | Liang | 361/695 |
| 2011/0141686 A1* | 6/2011 | Liu | 361/679.47 |
| 2012/0120601 A1* | 5/2012 | Tang et al. | 361/695 |

* cited by examiner

*Primary Examiner* — Alfred J Wujciak
(74) *Attorney, Agent, or Firm* — Chun-Ming Shih; HDLS IPR Services (57) ABSTRACT

A fixing assembly for a fan module is combined in a housing and includes at least one fixing base and at least one bottom pad. The fixing base has an accommodating space and a plurality of positioning portions in the accommodating space. The positioning portions are provided in pairs and symmetrical to each other. The locations of the positioning portions are designed for positioning various sizes of heat-dissipating fans. The bottom pad is configured to support the bottom of the fixing base. By this structure, various sizes of fan modules can be positioned in the housing.

10 Claims, 11 Drawing Sheets

FIXING ASSEMBLY FOR FAN MODULE

BACKGROUND OF THE INVENTION

1. Field of the Invention

The present invention relates to a fan fixing base, and in particular to a fixing assembly for a fan module.

2. Description of Prior Art

Traditionally, main boards, a power supply and other electronic devices are provided within a computer housing. Since these electronic devices generate a lot of heat during their operation, a plurality of heat-dissipating fans is often provided in the computer housing in order to maintain the normal operation of the whole computer system. For this purpose, a fan frame is provided within the computer housing and these heat-dissipating fans are fixed onto the fan frame. By means of the airflow generated by the heat-dissipating fans, the heat generated by the electronic devices can be taken away.

In general, the heat-dissipating fan is fixed into the computer housing or the fan frame within the computer housing by screws. However, fixing the fan by the screws is time-consuming and laborious, and should be completed by a special tool (i.e. screw driver). In order to reduce the time for fixing the fan by screws, a common solution is to reduce the number of screws. Although reducing the number of screws shortens the time for fixing the fan, the reduced number of screws decreases the fixing strength achieved by the screws, which causes the fan to vibrate during its operation.

Further, various sizes of fan frames are often provided in the conventional computer housing based on the size and number of the heat-dissipating fans mounted on the fan frame, thereby generating various fan modules of different sizes and orientations. However, it takes a lot of time and labor to assemble these different fan modules, which increases the production cost.

Therefore, in order to solve the above-mentioned problems, the present Inventor proposes a novel and reasonable structure based on his expert knowledge and deliberate researches.

SUMMARY OF THE INVENTION

The present invention is to provide a fixing assembly for a fan module, which is capable of combining and positioning various sizes of fan modules.

The present invention is to provide a fixing assembly for a fan module, which is capable of simplifying the process for assembling the heat-dissipating fan and reducing the vibration generated during the operation of the heat-dissipating fan.

The present invention provides a fixing assembly for a fan module, which is combined in a housing for allowing various sizes of heat-dissipating fans to be connected and positioned therein. The fixing assembly includes at least one fixing base and at least one bottom pad. The fixing base has an accommodating space and a plurality of positioning portions in the accommodating space. The positioning portions are provided in pairs and symmetrical to each other. The locations of the positioning portions are designed for positioning various sizes of heat-dissipating fans. The bottom pad is configured to support the bottom of the fixing base.

The present invention provides a fixing assembly for a fan module. An outer edge of the fixing base has a hook. The opposite side of the fixing base has a trough. The engagement between the hook and the trough makes a plurality of adjacent fixing bases to be engaged with each other, thereby adjusting the number and assembly of the heat-dissipating fans based on practical demands.

In comparison with prior art, the present invention has the following advantageous features. The fixing base of the fixing assembly is provided with a plurality of positioning portions in the accommodating space. The locations of the positioning portions are designed for positioning various sizes of heat-dissipating fans. When the heat-dissipating fan is assembled in the fixing base, the heat-dissipating fan abuts against the inner wall of the fixing base and part of the positioning portion. By this arrangement, the heat-dissipating fan can be firmly combined and positioned in the fixing base without using screws and a special tool, so that the process for assembling the fan module can be simplified. Further, the bottom pad supporting the bottom of the fixing base absorbs the vibration generated during the operation of the heat-dissipating fan, thereby reducing the noises caused by the vibration of the heat-dissipating fan. Further, each fixing base has a hook and a trough, so that adjacent two fixing bases can be connected to each other by means of the engagement between the hook and the trough. Also, the number and arrangement of the heat-dissipating fans can be adjusted based on practical demands. Therefore, the present invention really has practicability.

DETAILED DESCRIPTION OF THE INVENTION

The detailed description and technical contents of the present invention will become apparent with the following detailed description accompanied with related drawings. It is noteworthy to point out that the drawings is provided for the illustration purpose only, but not intended for limiting the scope of the present invention.

Figure 1:
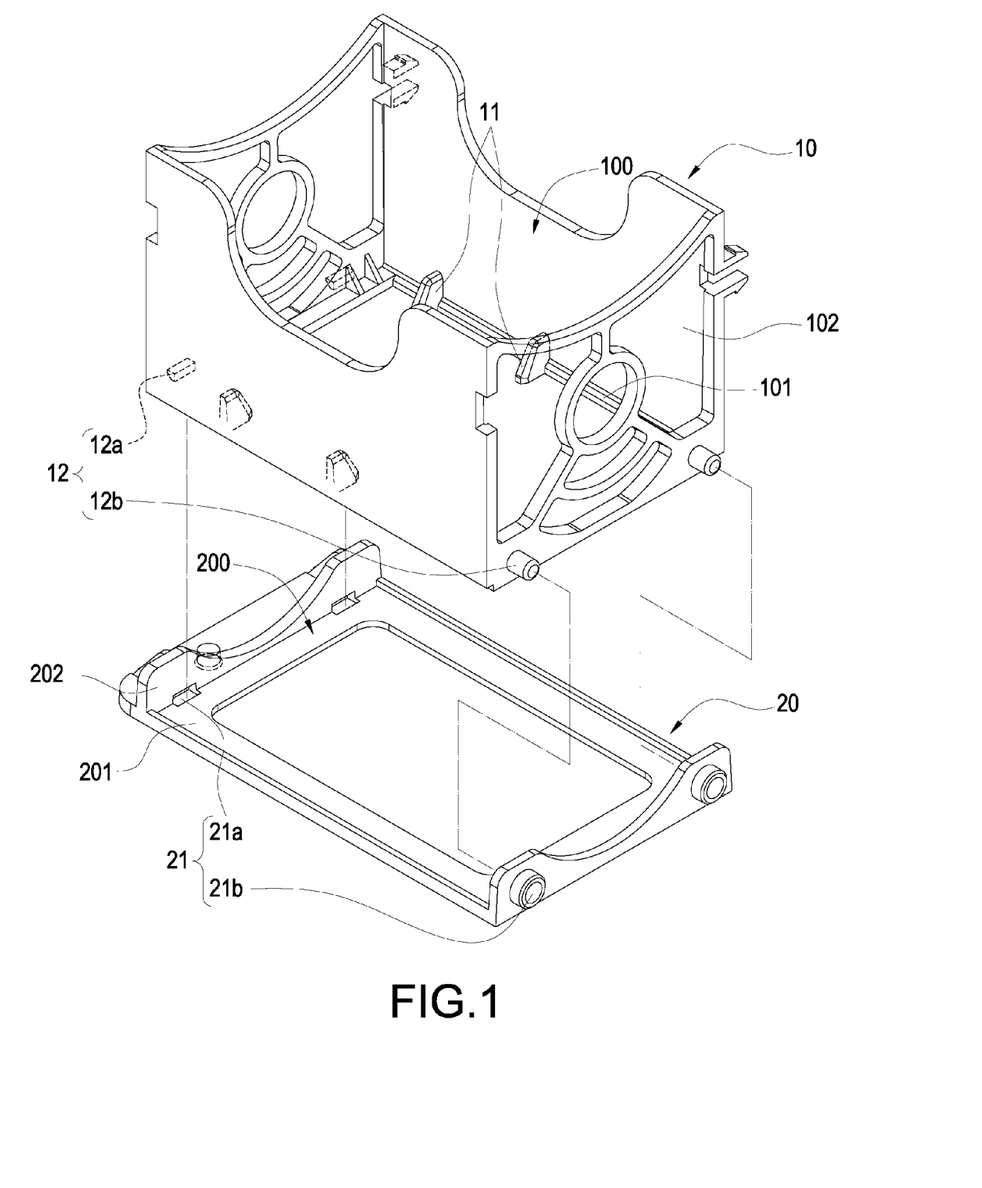
FIG. 1 is an assembled perspective view showing the fixing assembly for a fan module according to the present invention.

Please refer to FIG. 1, which is an assembled perspective view showing the fixing assembly for a fan module according to the present invention. The fixing assembly 1 for a fan module according to the present invention includes at least one fixing base 10 and at least one bottom pad 20.

The fixing base 10 has an accommodating space 100 and a plurality of positioning portions 11 provided in the accommodating space 100. These positioning portions 11 may be ribs or other positioning means. The positioning portions 11 are provided in pairs and symmetrical to each other. The locations of the positioning portions 11 are designed for positioning various sizes of heat-dissipating fans.

In the present embodiment, the fixing base 10 is a plastic frame. The fixing base 10 comprises a bottom frame 101 and a plurality of side plates 102 vertically connected to the periphery of the bottom frame 101. The bottom frame 101 and the side plates 102 define the accommodating space 100. Further, the positioning portions 11 are provided on the bottom frame 101 at intervals.

The bottom pad 20 is a rubber pad for absorbing the vibration generated during the operation of the fan module. The bottom pad 20 is configured to support the bottom of the fixing base 10. The bottom pad 20 comprises a frame plate 201 and a plurality of stopping pieces 202 formed on the frame plate 201. The frame plate 201 and the stopping pieces 202 define a supporting space 200. The fixing base 10 is disposed in the supporting space 200. The stopping pieces 202 abut against the outer side surfaces of the fixing base 10.

In practice, the bottom edge of the fixing base 10 has a plurality of first combining portions 12. The bottom pad 20 is provided with a plurality of second combining portions 21. The first combining portions 12 are combined with the second combining portions 21, thereby combining the fixing base 10 with the bottom pad 20.

In the present embodiment, the first combining portions 12 on one side of the fixing base 10 are protrusions 12a, and the second combining portions 21 on one side of the bottom pad 20 are troughs 21a. The first combining portions 12 (protrusions 12a) are engaged into the second combining portions 21 (troughs 21a). Alternatively, the first combining portions 12 on the other side of the fixing base 10 are posts 12b, and the second combining portions 21 on the other side of the bottom pad 20 are through-holes 21b. The first combining portions 12 (posts 12b) are inserted into the second combining portions 21 (through-holes 21b).

Figure 2:
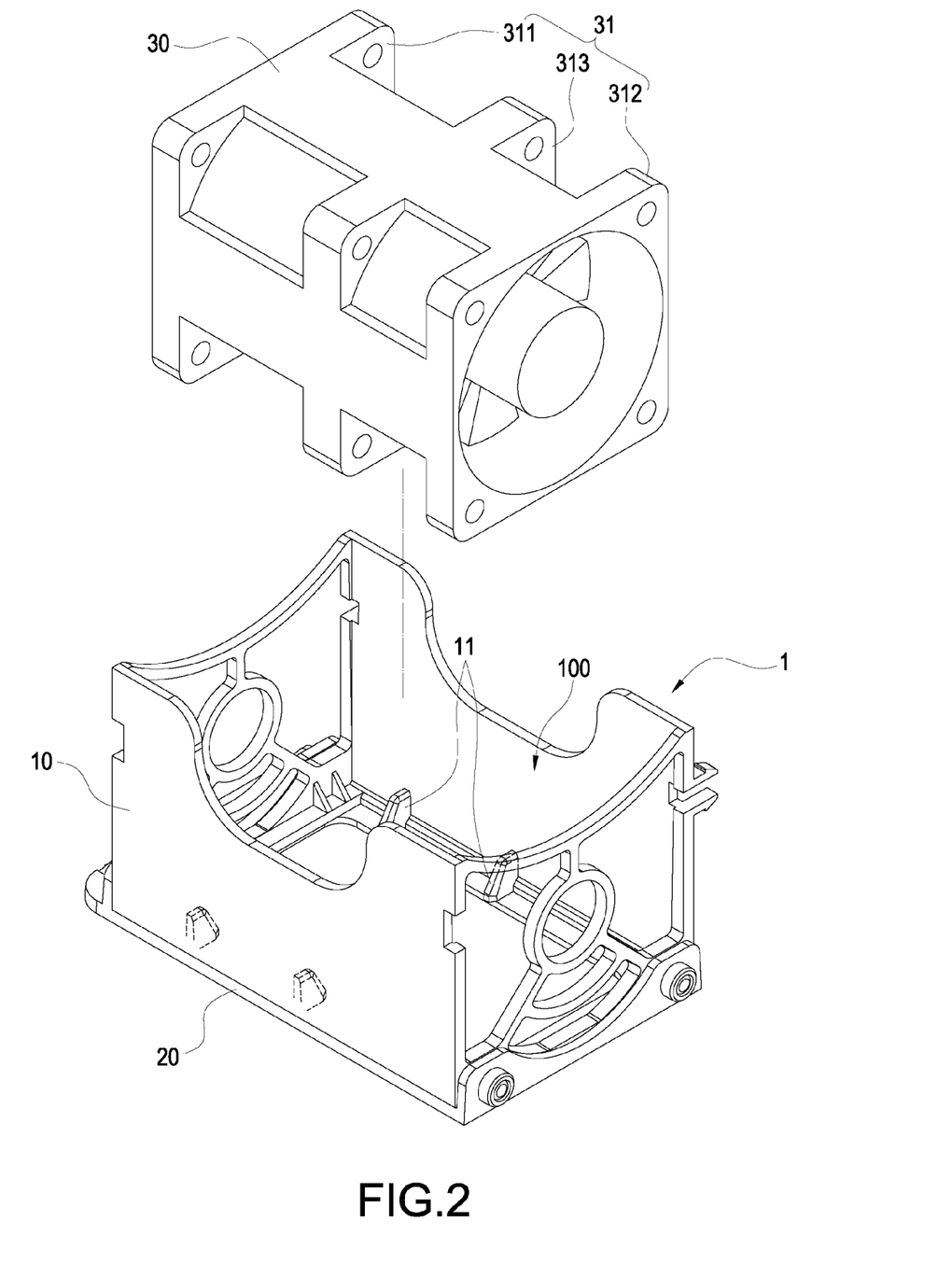
FIG. 2 is an assembled perspective view showing the fixing assembly for a fan module according to the present invention.
Figure 3:
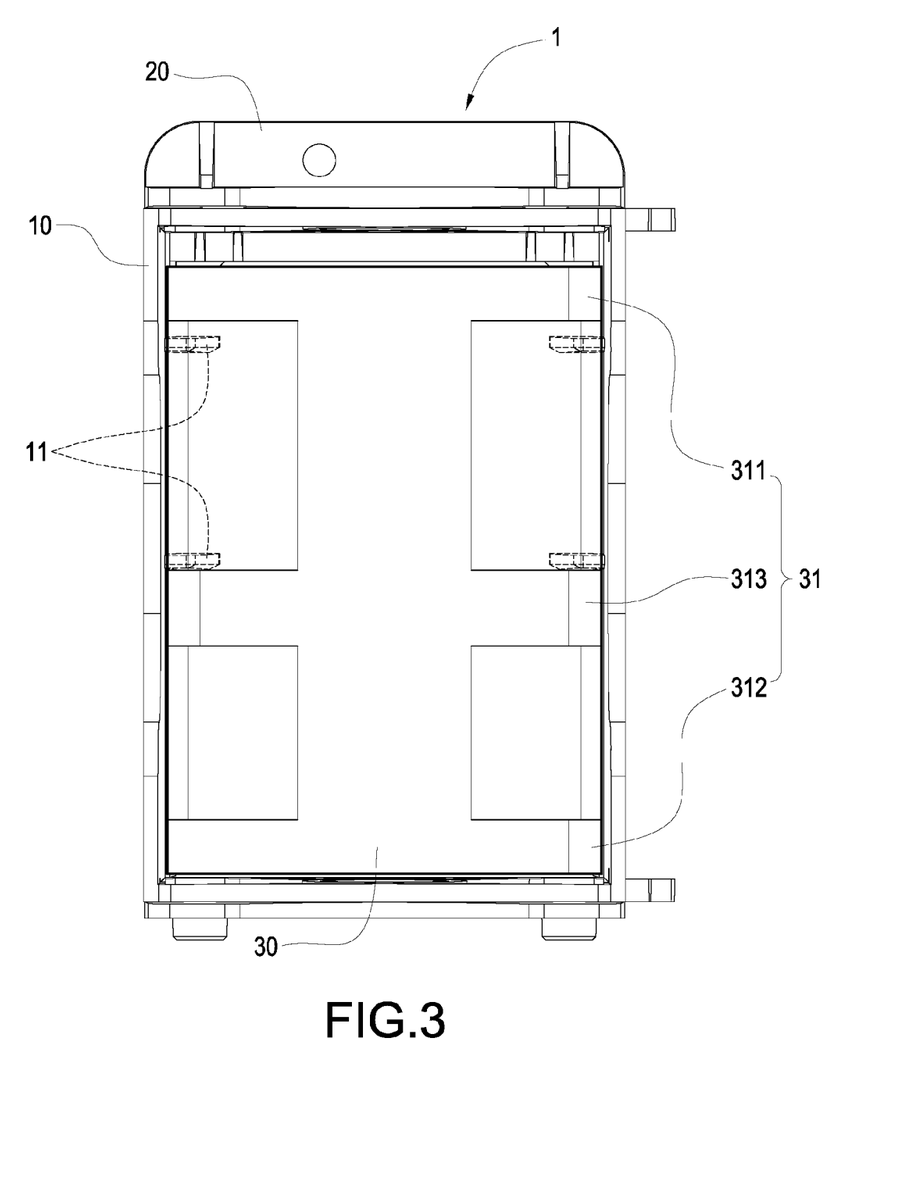
FIG. 3 is a plan view showing that the fixing assembly for a fan module according to the present invention is assembled completely.

Please refer to FIGS. 2 and 3. FIG. 2 is an assembled perspective view showing the fixing assembly for a fan module according to the present invention, and FIG. 3 is a plan view showing that the fixing assembly for a fan module according to the present invention is assembled completely. The fixing assembly for a fan module according to the present invention is configured to combine and position various sizes of heat-dissipating fans. In the present embodiment, one kind of heat-dissipating fan 30 is combined in the accommodating space 100 of the fixing base 10. The length of the heat-dissipating fan 30 is about 56 mm and has a plurality of positioning plates 31. The positioning plates 31 comprises a front positioning plate 311 and a rear positioning plate 312 located on both ends of the heat-dissipating fan 30, and a middle positioning plate 313 located in a middle region of the heat-dissipating fan 30. The front positioning plate 311 and the rear positioning plate 312 abut against the front inner wall and the rear inner wall of the fixing base 10 respectively. The middle positioning plate 313 abuts against part of the positioning portion 11 (located in the middle of the accommodating space 100). By this arrangement, the heat-dissipating fan 30 can be firmly combined and positioned in the fixing base 10.

Figure 4:
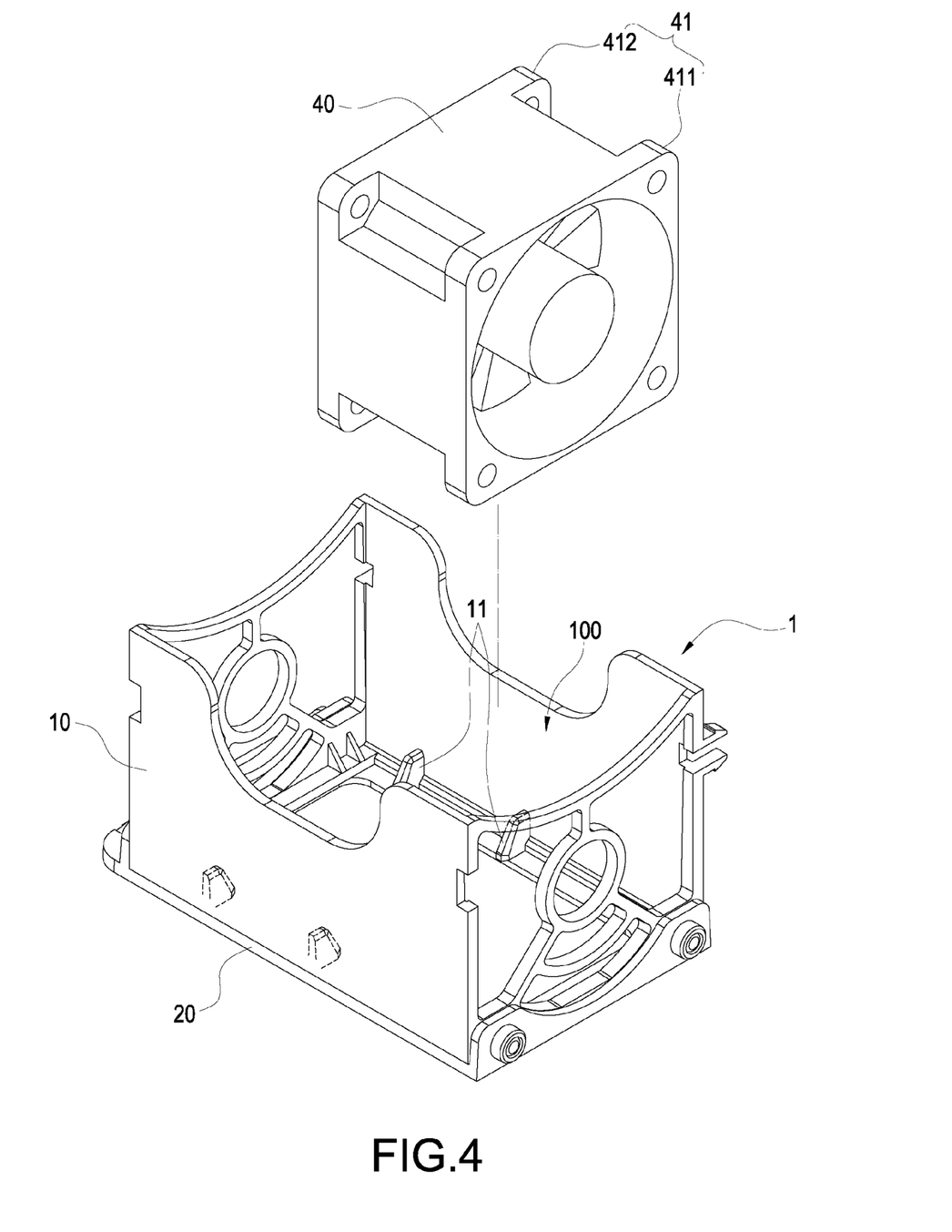
FIG. 4 is an assembled perspective view showing another arrangement of the fixing assembly for a fan module according to the present invention.
Figure 5:
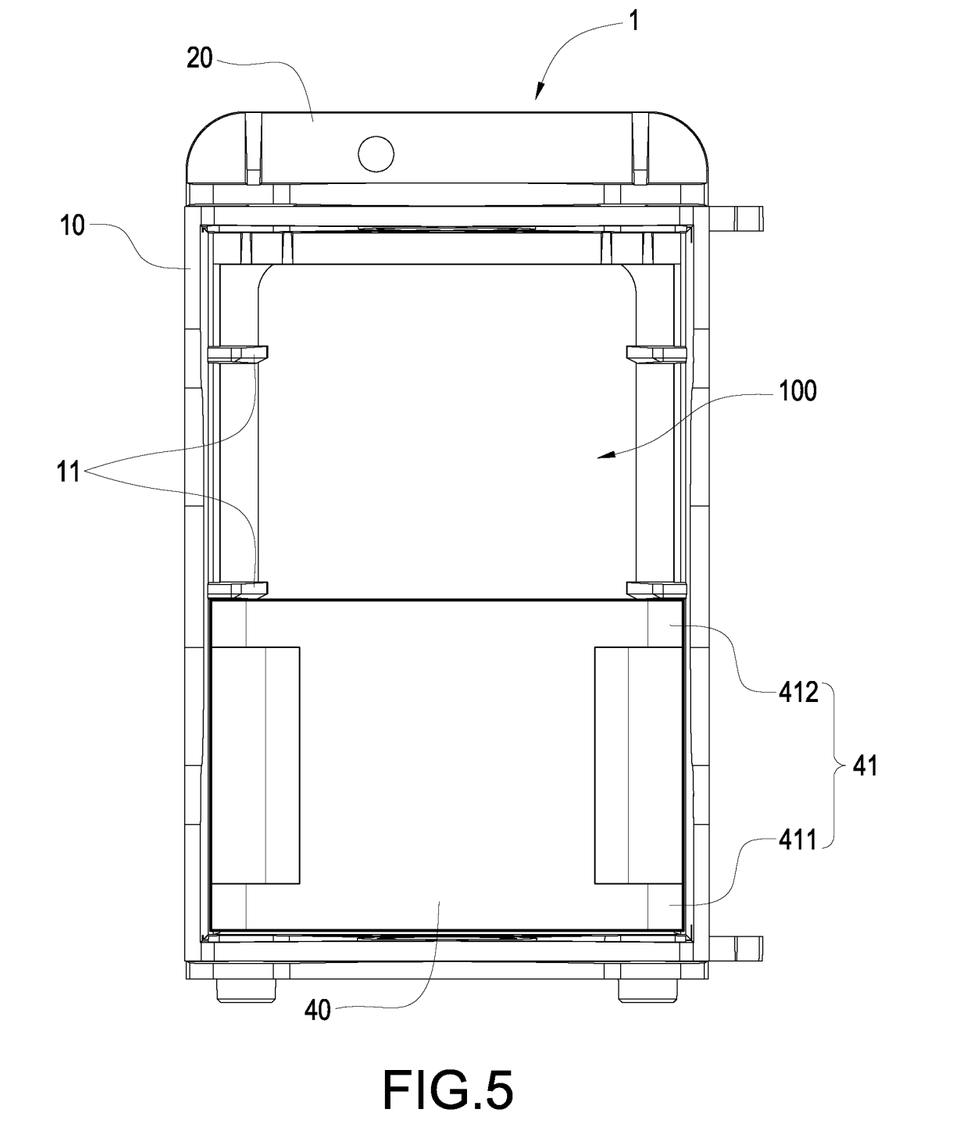
FIG. 5 is a plan view showing another arrangement of the fixing assembly for a fan module according to the present invention.

Please refer to FIGS. 4 and 5. FIG. 4 is an assembled perspective view showing another arrangement of the fixing assembly for a fan module according to the present invention, and FIG. 5 is a plan view showing another arrangement of the fixing assembly for a fan module according to the present invention. In this arrangement, another kind of heat-dissipating fan 40 is combined in the accommodating space 100 of the fixing base 10. The length of the heat-dissipating fan 40 is about 28 mm and has a plurality of positioning plates 41. The positioning plates 41 comprises a front positioning plate 411 and a rear positioning plate 412 located on both ends of the heat-dissipating fan 40. The front positioning plate 411 (or the rear positioning plate 412) abuts against the inner wall of the fixing base 10. The rear positioning plate 412 (or the front positioning plate 411) abuts against part of the positioning portion 11 (located in the middle of the accommodating space 100). In this way, the heat-dissipating fan 40 can be firmly combined and positioned in the fixing base 10.

Figure 6:
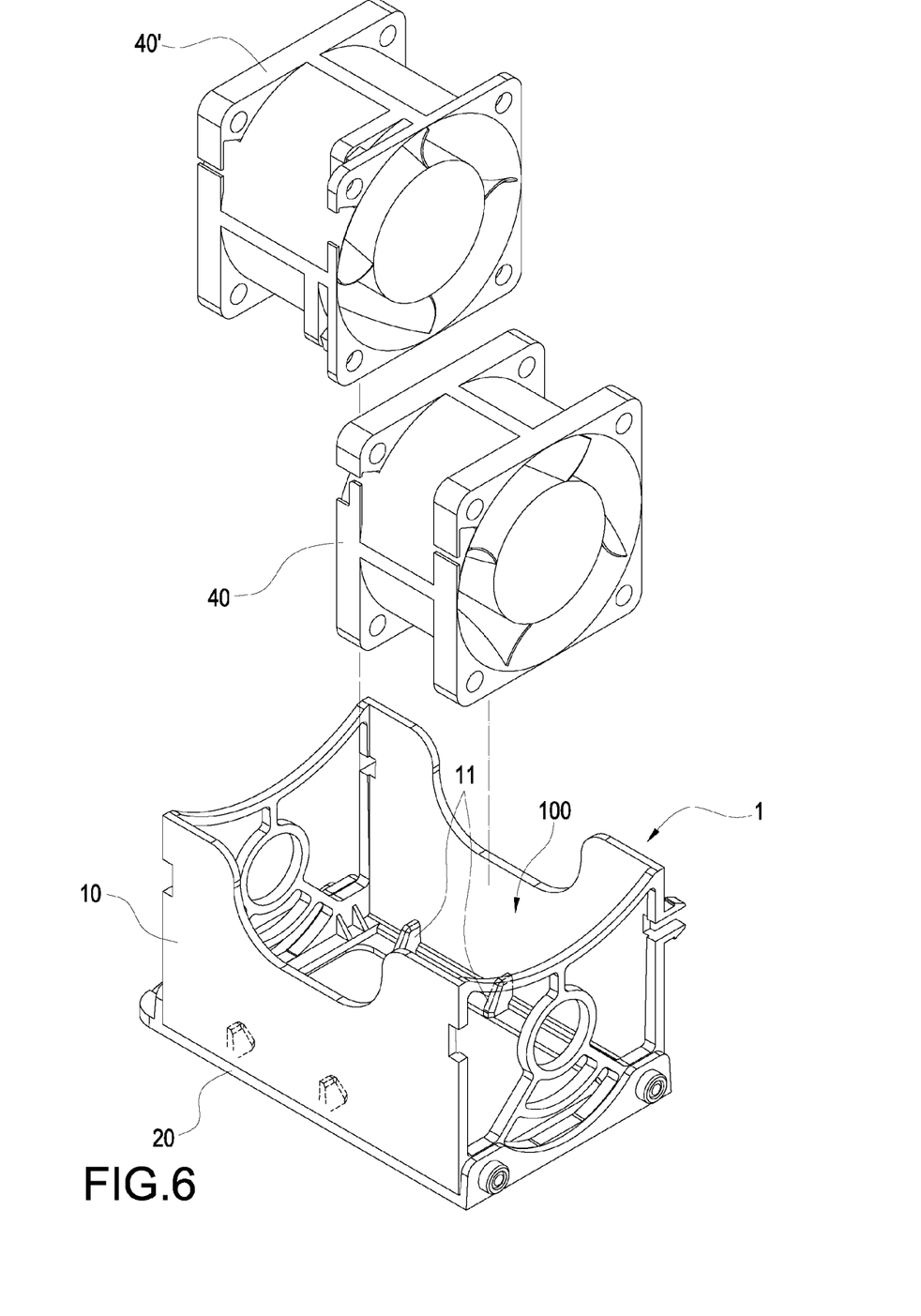
FIG. 6 is an assembled perspective view showing a further arrangement of the fixing assembly for a fan module according to the present invention.

Please refer to FIG. 6, which is an assembled perspective view showing a further arrangement of the fixing assembly for a fan module according to the present invention. In this arrangement, two heat-dissipating fans 40, 40' are combined in the accommodating space 100 of the fixing base 10. One side of the two heat-dissipating fans 40, 40' abut against two opposite inner walls of the fixing base 10. The other side of the two heat-dissipating fans 40, 40' abut against part of the positioning portion 11 (located in the middle of the accommodating space 100).

Figure 7:
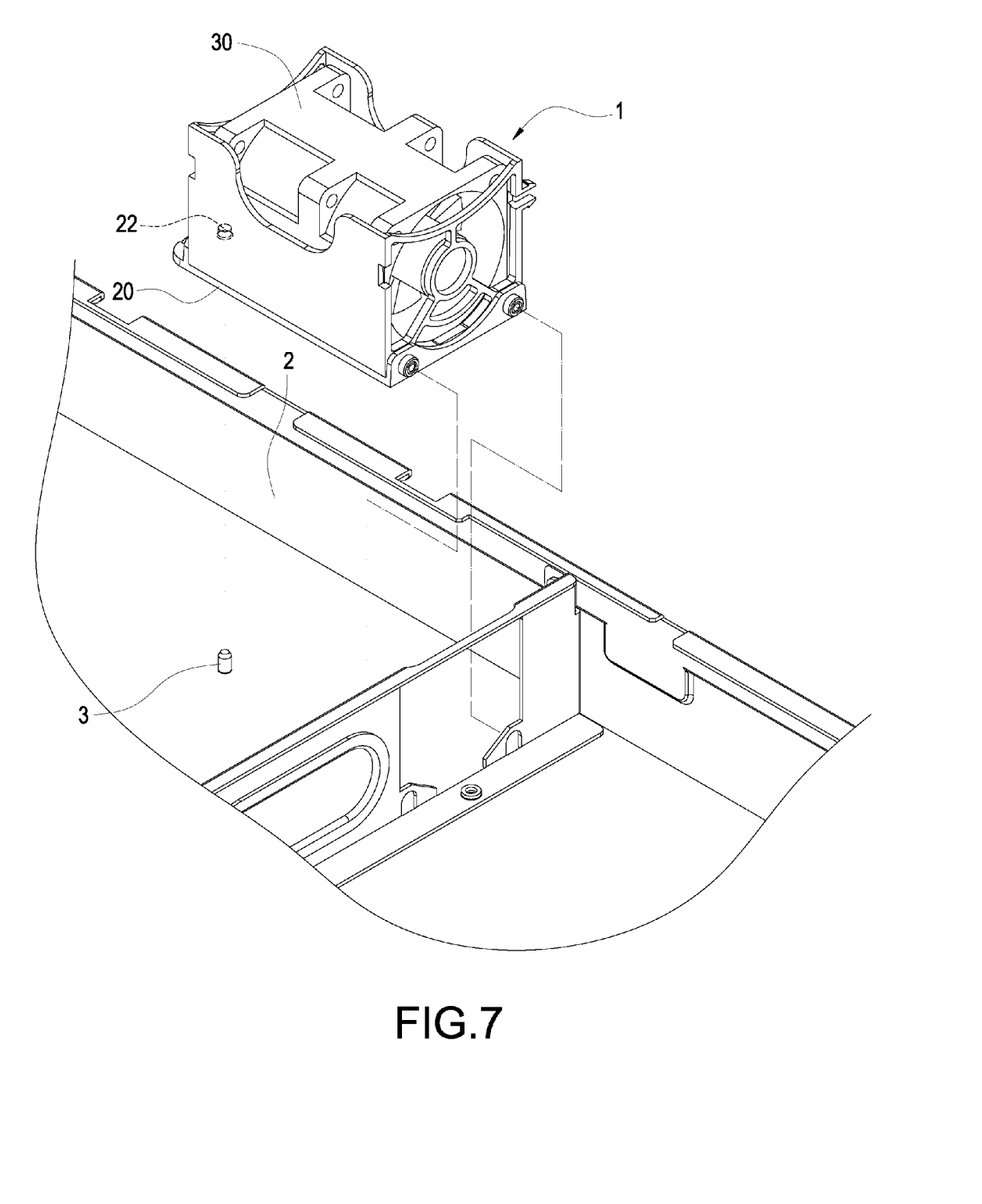
FIG. 7 is an assembled view showing that the fixing assembly for a fan module according to the present invention is fixed in a housing.
Figure 8:
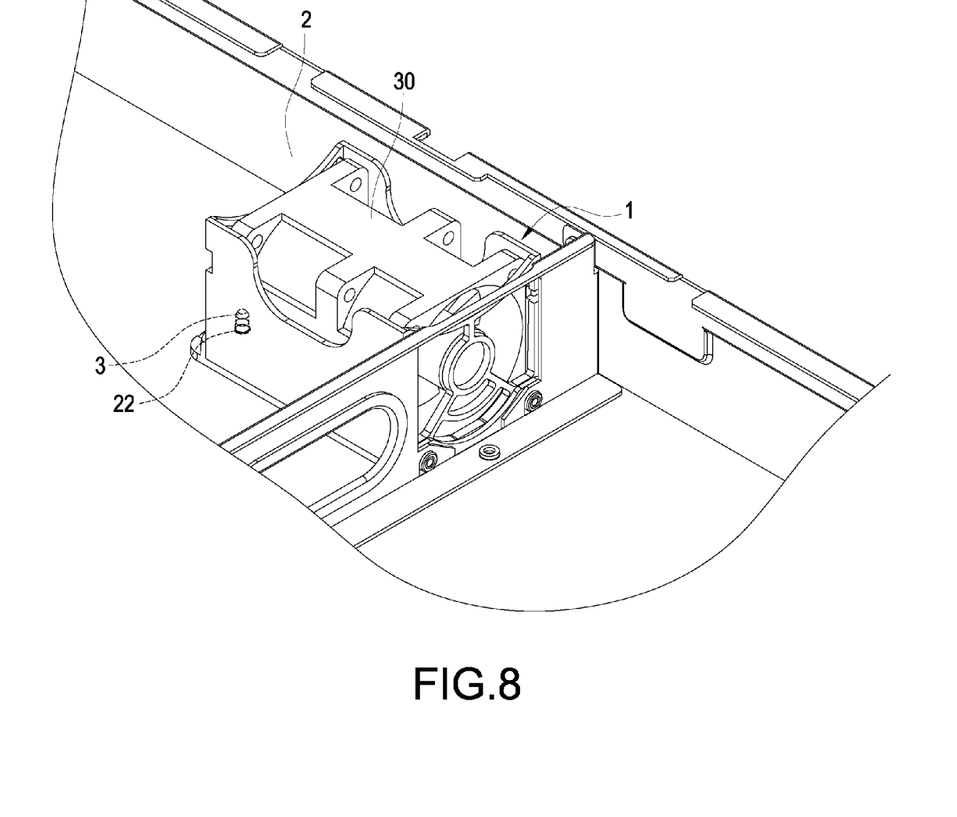
FIG. 8 is a perspective view showing the external appearance after the fixing assembly for a fan module according to the present invention is fixed in the housing.

Please refer to FIGS. 7 and 8. FIG. 7 is an assembled view showing that the fixing assembly for a fan module according to the present invention is fixed in a housing, and FIG. 8 is a perspective view showing the external appearance after the fixing assembly for a fan module according to the present invention is fixed in the housing. The fixing assembly 1 for a fan module according to the present invention is combined in a housing 2. The housing 2 has a fixing post 3. Further, the bottom of the bottom pad 20 has a fixing hole 22. The fixing post 3 is inserted into the fixing hole 22, so that the fixing base 10 assembled with the heat-dissipating fan 30 can be combined in the housing 2.

Figure 9:
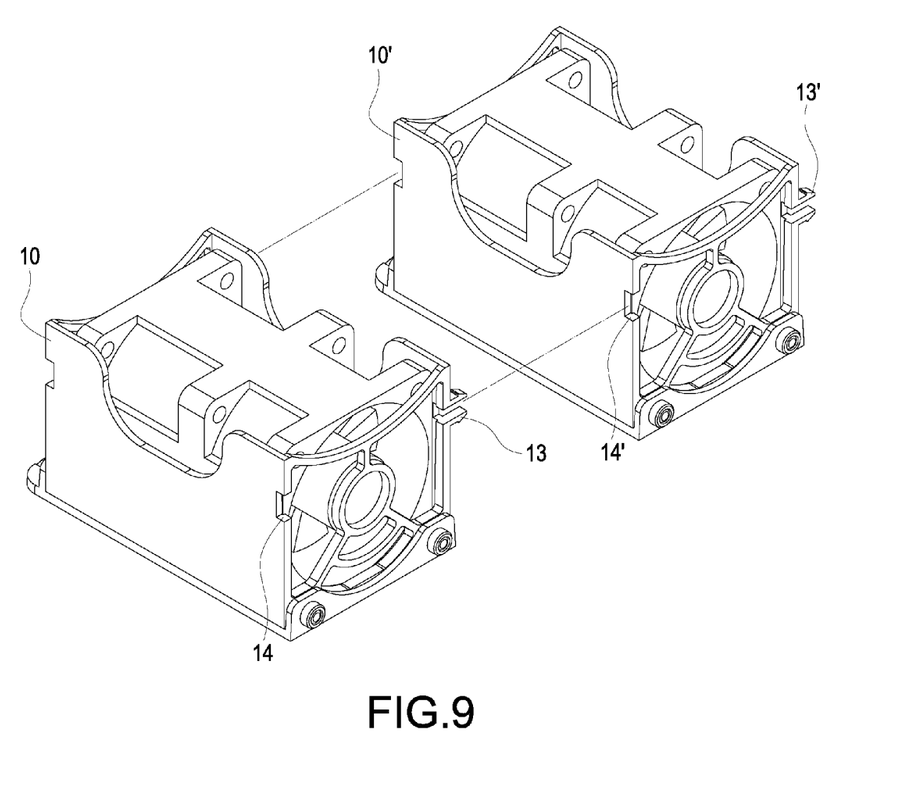
FIG. 9 is an assembled view showing another operating state of the fixing assembly for a fan module according to the present invention.
Figure 10:
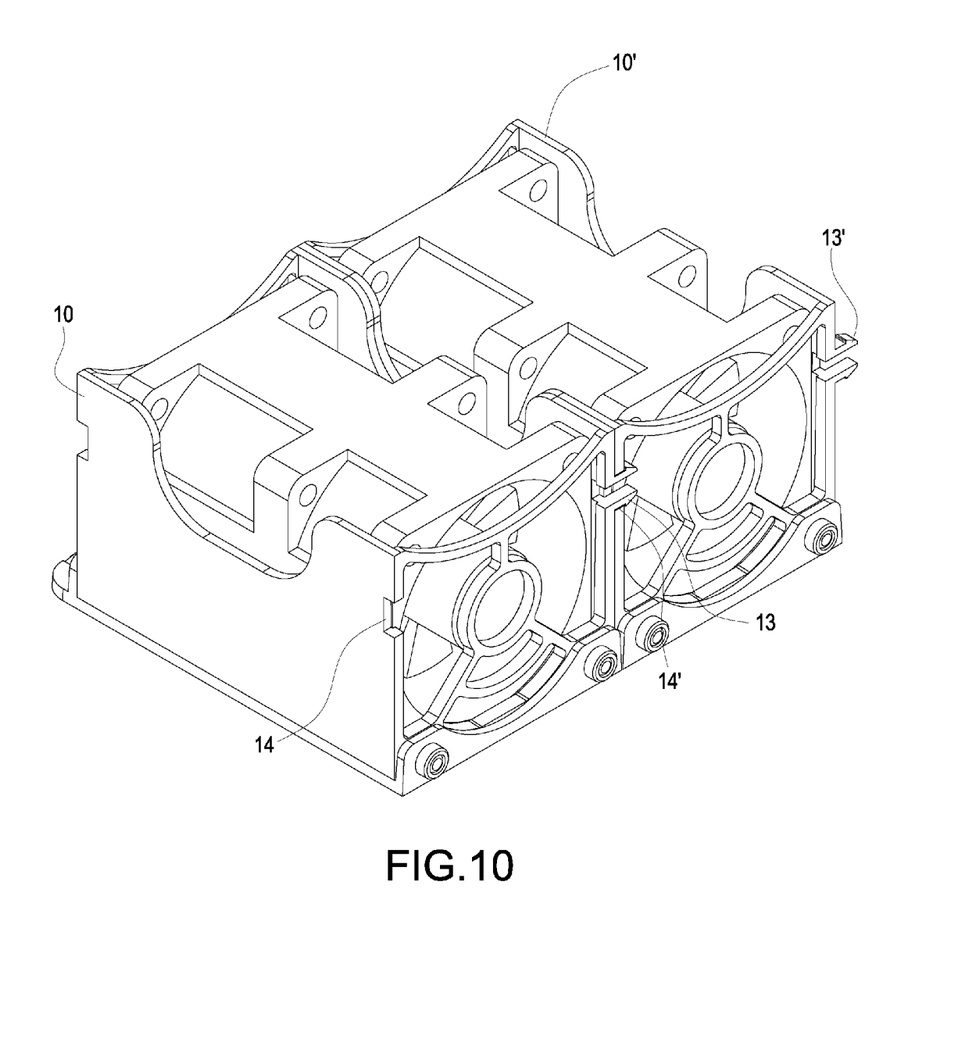
FIG. 10 is a perspective view showing the external appearance of another operating state of the fixing assembly for a fan module according to the present invention.

Please refer to FIGS. 9 and 10. FIG. 9 is an assembled view showing another operating state of the fixing assembly for a fan module according to the present invention, and FIG. 10 is a perspective view showing the external appearance of another operating state of the fixing assembly for a fan module according to the present invention. It should be noted that, an outer side edge of the fixing base 10 has a hook 13. The opposite side of the fixing base 10 has a trough 14. When there are a plurality of fixing bases 10 such as two fixing bases 10, 10' as shown in FIG. 9, two opposite sides of the other fixing base 10' also has a hook 13' and a trough 14' respectively. The hook 13 of the fixing base 10 is hooked into the trough 14' of the other fixing base 10', thereby fixedly connecting two adjacent fixing bases 10, 10'.

Figure 11:
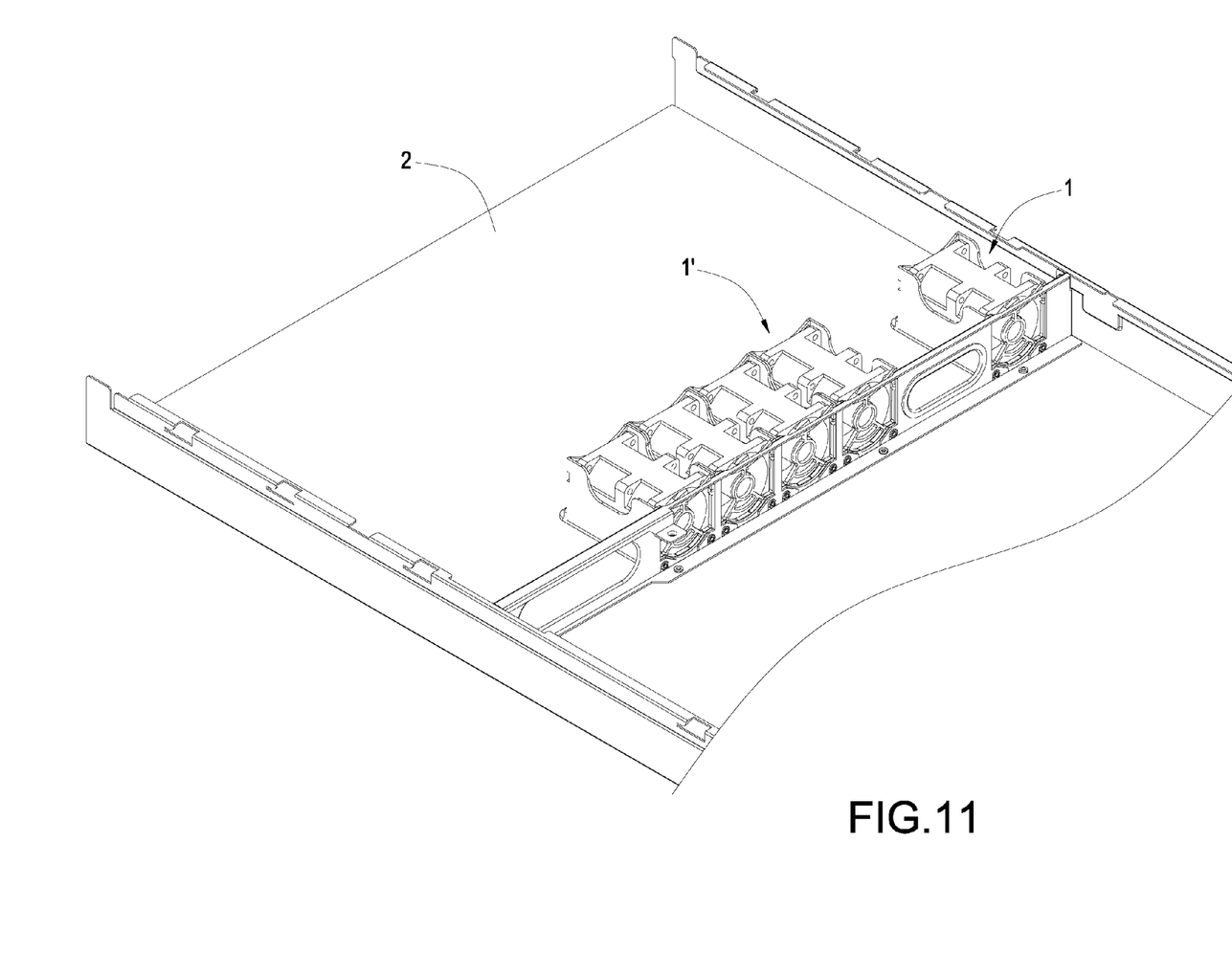
FIG. 11 is an assembled view showing that another operating state of the fixing assembly for a fan module according to the present invention is fixed in the housing.

Please refer to FIG. 11, which is an assembled view showing that another operating state of the fixing assembly for a fan module according to the present invention is fixed in the housing. FIG. 11 shows the fixing assembly 1 having one fixing base and the fixing assembly 1' having a plurality of fixing bases. These two kinds of fixing assemblies 1, 1' can be simultaneously combined in the housing 2 based on practical demands. It should be noted that, the number of the fixing base in the fixing assembly 1' is not limited to a specific one and can be adjusted based on practical demands. Thus, the present invention indeed demonstrates convenience and practicability.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A fixing assembly for a fan module, combined in a housing for allowing various sizes of heat-dissipating fans to be connected and positioned therein, the fixing assembly including:
   at least one fixing base having an accommodating space and a plurality of positioning portions in the accommodating space, the positioning portions being provided in pairs and symmetrical to each other, the locations of the positioning portions being designed for positioning various sizes of heat-dissipating fans; and
   at least one bottom pad configured to support the bottom of the fixing base,
   wherein an outer side edge of the fixing base has a hook, and the other side edge of the fixing base has a trough, and
   wherein the number of the fixing base is plural, the hook of the fixing base is hooked into the trough of another adjacent fixing base.

2. The fixing assembly for a fan module according to claim 1, wherein the fixing base comprises a bottom frame and a plurality of side plates vertically connected to the periphery of the bottom frame, the bottom frame and the side plates define the accommodating space.

3. The fixing assembly for a fan module according to claim 2, wherein the positioning portions are provided on the bottom frame at intervals.

4. The fixing assembly for a fan module according to claim 1, wherein the bottom edge of the fixing base has a plurality of first combining portions, the bottom pad is provided with a plurality of second combining portions, the first combining portions are combined with the second combining portions.

5. The fixing assembly for a fan module according to claim 4, wherein the first combining portions are protrusions, the second combining portions are trough, the first combining portions are engaged into the second combining portions.

6. The fixing assembly for a fan module according to claim 4, wherein the first combining portions are posts, the second combining portions are through-holes, the first combining portions are inserted into the second combining portions.

7. The fixing assembly for a fan module according to claim 1, wherein the fixing base is a plastic frame, and the bottom pad is a rubber pad.

8. The fixing assembly for a fan module according to claim 1, wherein the positioning portions are ribs.

9. The fixing assembly for a fan module according to claim 1, wherein the bottom pad comprises a frame plate and a plurality of stopping pieces formed on the frame plate, the frame plate and the stopping pieces define a supporting space, the fixing base is disposed in the supporting space.

10. The fixing assembly for a fan module according to claim 9, wherein the stopping pieces abut against an outer side surface of the fixing base.

\* \* \* \* \*